United States Patent
Asano et al.

(10) Patent No.: US 10,650,949 B2
(45) Date of Patent: May 12, 2020

(54) SEMICONDUCTOR DEVICE

(71) Applicant: Renesas Electronics Corporation, Tokyo (JP)

(72) Inventors: Hironori Asano, Tokyo (JP); Noriaki Matsuno, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/116,681

(22) Filed: Aug. 29, 2018

(65) Prior Publication Data
US 2019/0148047 A1 May 16, 2019

(30) Foreign Application Priority Data

Nov. 16, 2017 (JP) .................................. 2017-220876

(51) Int. Cl.
| H03K 3/282 | (2006.01) |
| H01F 17/00 | (2006.01) |
| H03H 7/01 | (2006.01) |
| H01L 27/06 | (2006.01) |
| H01L 23/522 | (2006.01) |
| H01L 23/66 | (2006.01) |
| H01L 23/64 | (2006.01) |
| H03H 1/00 | (2006.01) |

(52) U.S. Cl.
CPC ..... *H01F 17/0006* (2013.01); *H01L 23/5227* (2013.01); *H01L 23/645* (2013.01); *H01L 23/66* (2013.01); *H01L 27/0629* (2013.01); *H03H 7/1725* (2013.01); *H03H 7/1741* (2013.01); *H01F 2017/0026* (2013.01); *H03H 7/0115* (2013.01); *H03H 2001/0085* (2013.01)

(58) Field of Classification Search
CPC ........ H01F 17/0006; H01F 2017/0026; H03H 7/1741; H03H 7/1725; H03H 7/0115; H03H 2001/0085; H01L 27/0629; H01L 23/66; H01L 23/645; H01L 23/5227
USPC ............................... 331/117 R, 117 FE, 167
See application file for complete search history.

(56) References Cited

U.S. PATENT DOCUMENTS

| 7,088,195 B2 * | 8/2006 | Muramatsu | .......... H03B 5/1228 331/117 FE |
| 7,218,182 B2 * | 5/2007 | Muramatsu | .......... H03B 5/1228 331/117 FE |
| 7,847,667 B2 * | 12/2010 | Kinget | ................ H01L 23/5227 336/200 |
| 7,952,444 B2 * | 5/2011 | Xiong | .................. H03B 5/1228 331/108 C |

(Continued)

FOREIGN PATENT DOCUMENTS

JP        2000-260939 A        9/2000

*Primary Examiner* — Richard Tan
(74) *Attorney, Agent, or Firm* — McDermott Will & Emery LLP

(57) ABSTRACT

A semiconductor device capable of reducing in size thereof and suppressing degradation in the characteristics of circuit components is provided. The semiconductor device includes an LC circuit comprised of a spiral inductor provided over a semiconductor substrate and a capacitive element coupled with the spiral inductor. The spiral inductor includes a central area encircled with a metal wiring and a peripheral area other than the central area. The capacitive element is formed in an upper-layer or a lower-layer position corresponding to the peripheral area other than the central area.

7 Claims, 16 Drawing Sheets

(56) References Cited

U.S. PATENT DOCUMENTS

| | | | |
|---|---|---|---|
| 9,030,029 B2* | 5/2015 | Lin | H01L 23/36 |
| | | | 257/516 |
| 2014/0036406 A1* | 2/2014 | Tesson | H01L 23/4824 |
| | | | 361/281 |
| 2015/0364417 A1* | 12/2015 | Lee | H01L 23/5227 |
| | | | 257/531 |
| 2016/0056762 A1* | 2/2016 | Ximenes | H03B 5/1265 |
| | | | 331/117 FE |

* cited by examiner

SEMICONDUCTOR DEVICE

CROSS-REFERENCE TO RELATED APPLICATIONS

The disclosure of Japanese Patent Application No. 2017-220876 filed on Nov. 16, 2017 including the specification, drawings and abstract is incorporated herein by reference in its entirety.

BACKGROUND

The present disclosure relates to a technology effectively applicable to a semiconductor device, for example, an LC circuit.

In recent years, demand for computer equipment using radio such as Bluetooth (registered trademark) has been increased and it has been required to integrate a radio circuit into one chip for incorporation into wearable devices. Under such circumstances, radio circuits have been increasingly incorporated into semiconductor devices such as microcomputers and SoCs (System-on-a-Chips).

Therefore, semiconductor devices tend to increase in a packaging area.

In this regard, Japanese Unexamined Patent Application Publication No. 2000-260939 proposes a technology in which a spiral inductor and a capacitive element are superposed and disposed for size reduction of the circuit components of a radio circuit.

[Patent Document 1] Unexamined Patent Application Publication No. 2000-260939

SUMMARY

In the above method, however, a capacitive electrode is disposed in an inductor central area where magnetic flux of the spiral inductor is most concentrated and there is a possibility of degradation in the characteristics of the inductor. Specifically, there is a possibility of an inductance drop and Q-value reduction.

The present disclosure has been made to solve the above problem and provides a semiconductor device capable of reducing a size of the circuit components thereof and suppressing degradation in characteristics thereof.

Other problems and novel features will be apparent from the description in this specification and the accompanying drawings.

A semiconductor device according to some aspect of the present disclose includes an LC circuit comprised of a spiral inductor provided over a semiconductor substrate and a capacitive element coupled with the spiral inductor. The spiral inductor includes a central area encircled with a metal wiring and a peripheral area other than the central area. The capacitive element is formed in an upper-layer or a lower-layer position corresponding to the peripheral area other than the central area.

According to an embodiment, the capacitive element is formed in an upper-layer or a lower-layer position corresponding to the peripheral area other than the central area of the spiral inductor. Thus, since a capacitive element is not disposed in an area where magnetic flux of the spiral inductor is concentrated, degradation in the characteristics of the inductor can be suppressed. Further, since the capacitive element is disposed in an upper-layer or a lower-layer position corresponding to the peripheral area of the spiral inductor, it is possible to suppress increase in a layout area and reduce a size of the semiconductor device.

DETAILED DESCRIPTION

Figure 1:
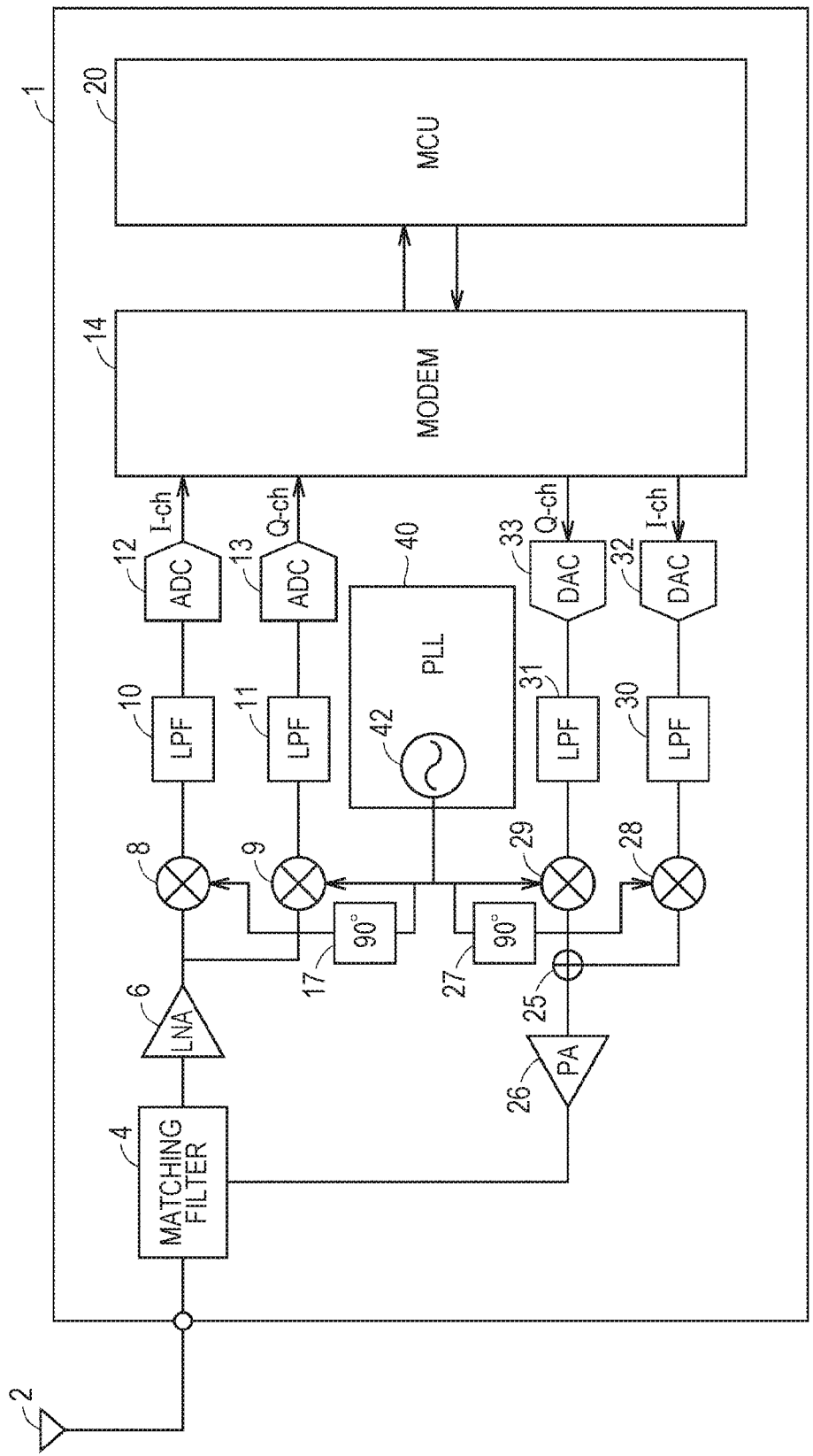
FIG. 1 is a drawing illustrating a configuration of a radio circuit 1 incorporated into a semiconductor device based on First Embodiment.

A detailed description will be given to embodiments with reference to the drawings. In the drawings, identical or equivalent elements will be marked with identical reference numerals and a description thereof will not be repeated.

First Embodiment

FIG. 1 illustrates a configuration of a radio circuit 1 incorporated into a semiconductor device based on First Embodiment.

As shown in FIG. 1, the radio circuit 1 is coupled with an antenna 2. The radio circuit 1 includes a matching filter 4, an LNA (Low Noise Amplifier) 6, mixers 8, 9, 28, and 29, LPFs 10, 11, 31, and 30, ADCs (Analog Digital Converters) 12 and 13, PA (Power Amplifier) 26, DACs (Digital Analog Converters) 32 and 33, a frequency mixer 25, phase adjustment circuits 17 and 27, a PLL (Phase Locked Loop) circuit 40, a modem 14, and an MCU (Micro Control Unit) 20.

The radio circuit 1 operates in accordance with instructions from the MCU 20 controlling the entire radio circuit and performs transmission/reception processing via the antenna 2.

The matching filter 4 is coupled with the antenna 2.

The matching filter 4 is a circuit conducting impedance matching on signals received at the antenna 2 or transmit signals transmitted to the antenna 2.

A description will be given to reception processing.

A receive signal received via the matching filter 4 is amplified by the LNA 6 and inputted to the mixers 8 and 9.

The PLL circuit 40 includes an oscillation circuit 42. The oscillation circuit 42 outputs a desired oscillating frequency. The PLL circuit 40 adjusts the phase of a signal with a desired oscillating frequency generated at the oscillation circuit 42 and outputs the signal. The oscillation circuit 42 may be a VCO (Voltage-Controlled Oscillator).

The signal with the desired oscillating frequency outputted from the PLL circuit 40 is inputted to the mixer 8 via the phase adjustment circuit 17 adjusting phases by 90°. The signal with the desired oscillating frequency outputted from the PLL circuit 40 is also inputted directly to the mixer 9.

The mixers 8 and 9 generate baseband signals of I-ch and Q-ch based on the RF signal amplified by the LNA 6 and the signal with the desired oscillating frequency.

The baseband signals of I-ch and Q-ch respectively outputted from the mixers 8 and 9 are passed through the LPFs 10 and 11. The LPFs 10 and 11 perform filtering processing for removing a high frequency component from inputted signals and output baseband signals converted into desired frequencies to the ADCs 12 and 13.

The baseband signals of I-ch and Q-ch are converted into digital signals by the ADCs 12 and 13 and inputted as data to the modem 14. The modem 14 modulates transmit signals and outputs the signals to a transmission-related circuit and demodulates receive signals from a reception-related circuit and outputs the signals to the MCU 20.

A description will be given to transmission processing. The transmission processing is reverse to the reception processing.

The PLL circuit 40 oscillates and outputs a signal with a desired transmission frequency.

The signal with the desired transmission frequency outputted from the PLL circuit 40 is inputted to the mixer 28 via the phase adjustment circuit 27 adjusting phases by 90°. The signal with the desired transmission frequency outputted from the PLL circuit 40 is also inputted directly to the mixer 29.

The DACs 32 and 33 perform conversion into baseband signals (control voltage) in accordance with transmit data of I-ch and Q-ch from the modem 14.

The baseband signals are inputted to the mixers 28 and 29 via the LPFs 30 and 31.

The mixers 28 and 29 generate signals based on mixing of the baseband signals inputted via the LPFs 30 and 31 and the signal with the desired transmission frequency.

The frequency mixer 25 mixes the signals outputted from the mixers 28 and 29 and outputs a radio frequency signal.

The PA 26 amplifies the output of the frequency mixer 25 and outputs the amplified signal to the matching filter 4. The matching filter 4 conducts impedance matching on the radio frequency signal from the PA 26 and outputs the result of matching via the antenna 2.

Figure 2:
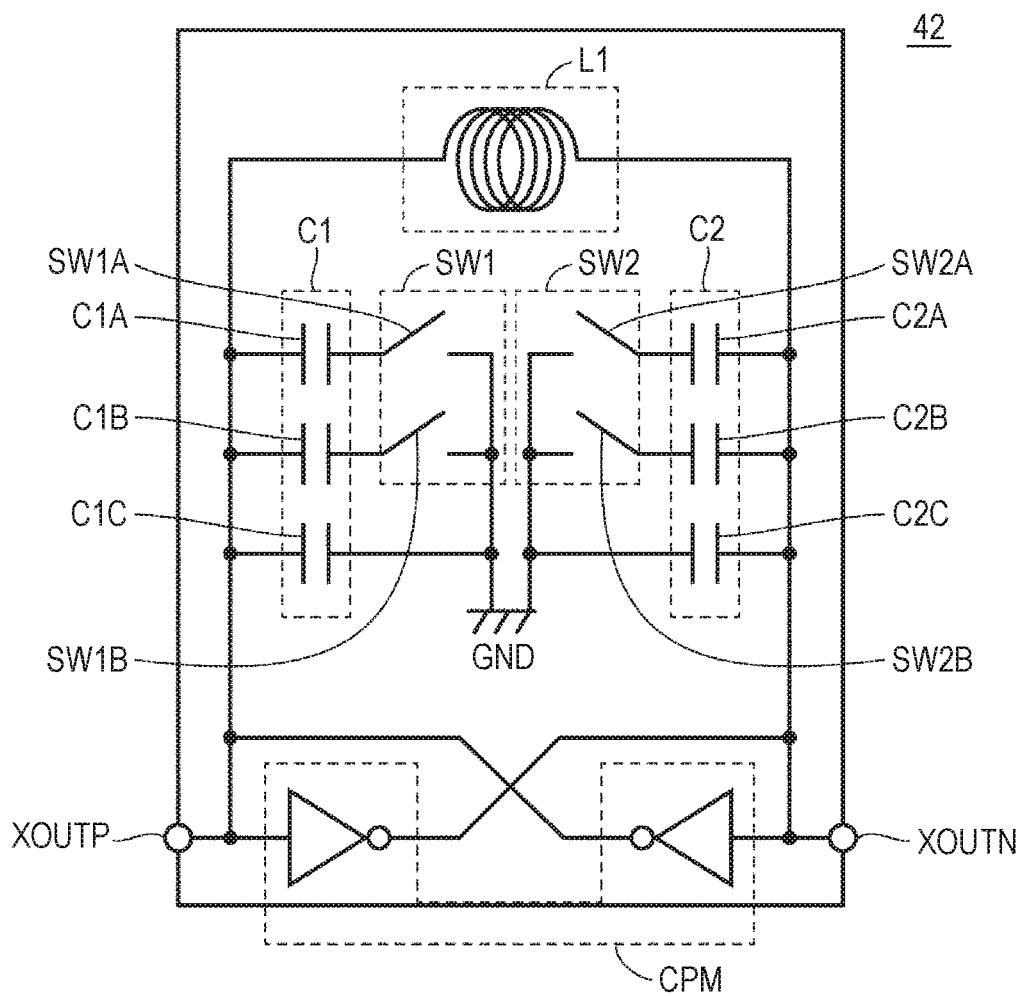
FIG. 2 is a circuit diagram of an oscillation circuit 42 based on First Embodiment.

FIG. 2 is a circuit diagram of an oscillation circuit 42 based on First Embodiment.

Referring to FIG. 2, in this example, a configuration of an LC oscillation circuit is illustrated.

The LC oscillation circuit is formed, for example, in a semiconductor substrate (semiconductor chip) such as of single crystal silicon using a publicly known CMOS manufacturing process.

The oscillation circuit 42 includes an inductor L1 generating oscillation signals, capacitors C1 and C2, switch circuits SW1 and SW2 switching continuity between the capacitors, and a cross couple MOS circuit CPM so coupled as to function as a negative resistance.

Oscillation signals are outputted from output nodes XOUTP, XOUTN.

Since the capacitance value of the LC oscillation circuit is varied by changing setting of the switch circuits SW1 and SW2, an oscillating frequency can be changed.

The capacitor C1 includes a plurality of capacitors C1A, C1B, and C1C.

The capacitor C2 includes a plurality of capacitors C2A, C2B, C2C.

The switch circuit SW1 includes switch elements SW1A, SW1B.

The switch circuit SW2 includes switch elements SW2A, SW2.

Figure 3:
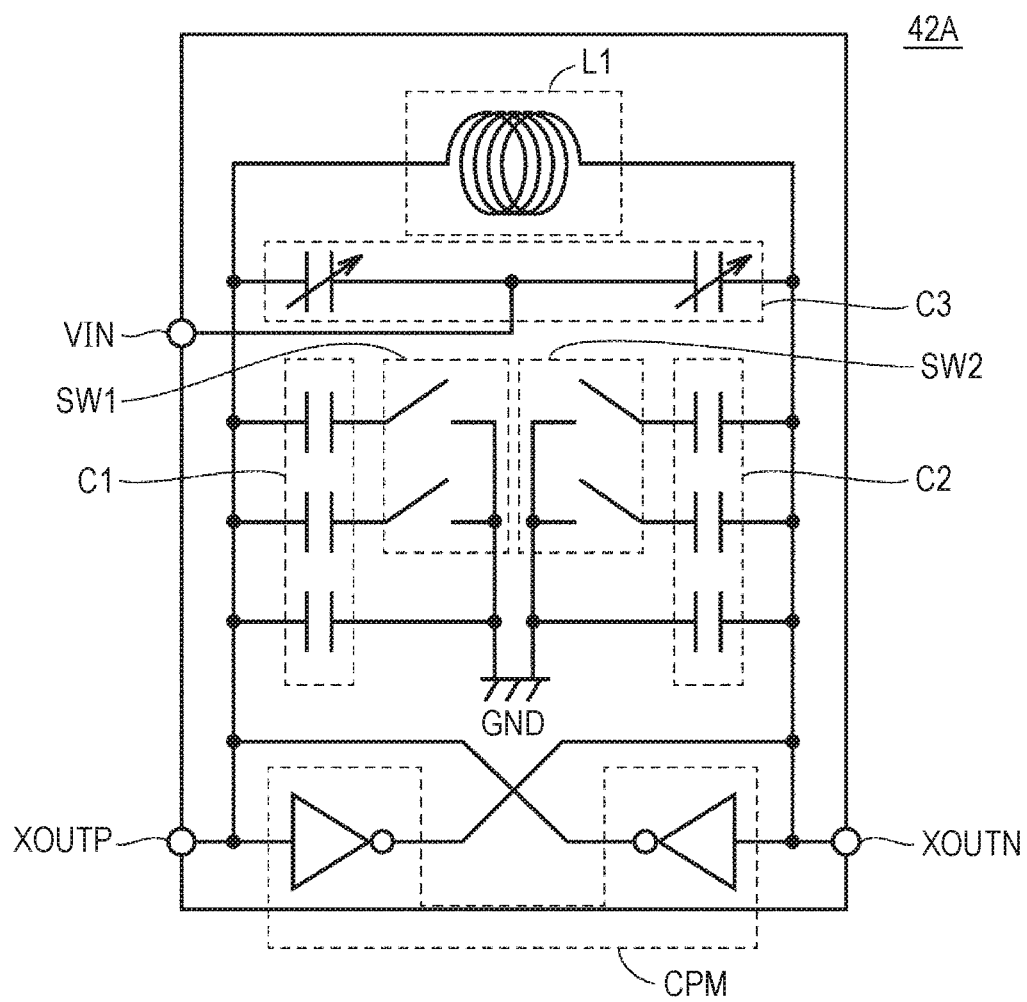
FIG. 3 is a circuit diagram of another oscillation circuit 42A based on First Embodiment.

FIG. 3 is a circuit diagram of another oscillation circuit 42A based on First Embodiment.

Referring to FIG. 3, in this example, a voltage-controlled oscillation circuit (VCO) 42A is illustrated.

As compared with the configuration shown in FIG. 2, the VCO 42A is further provided with a variable electrostatic capacitive element C3. In addition, the VCO 42A is provided with an input node VIN coupled with an electrode of the variable electrostatic capacitive element C3.

An oscillating frequency can also be adjusted by inputting a voltage from the input node VIN to change a capacitance value of the variable electrostatic capacitive element C3.

Figure 4:
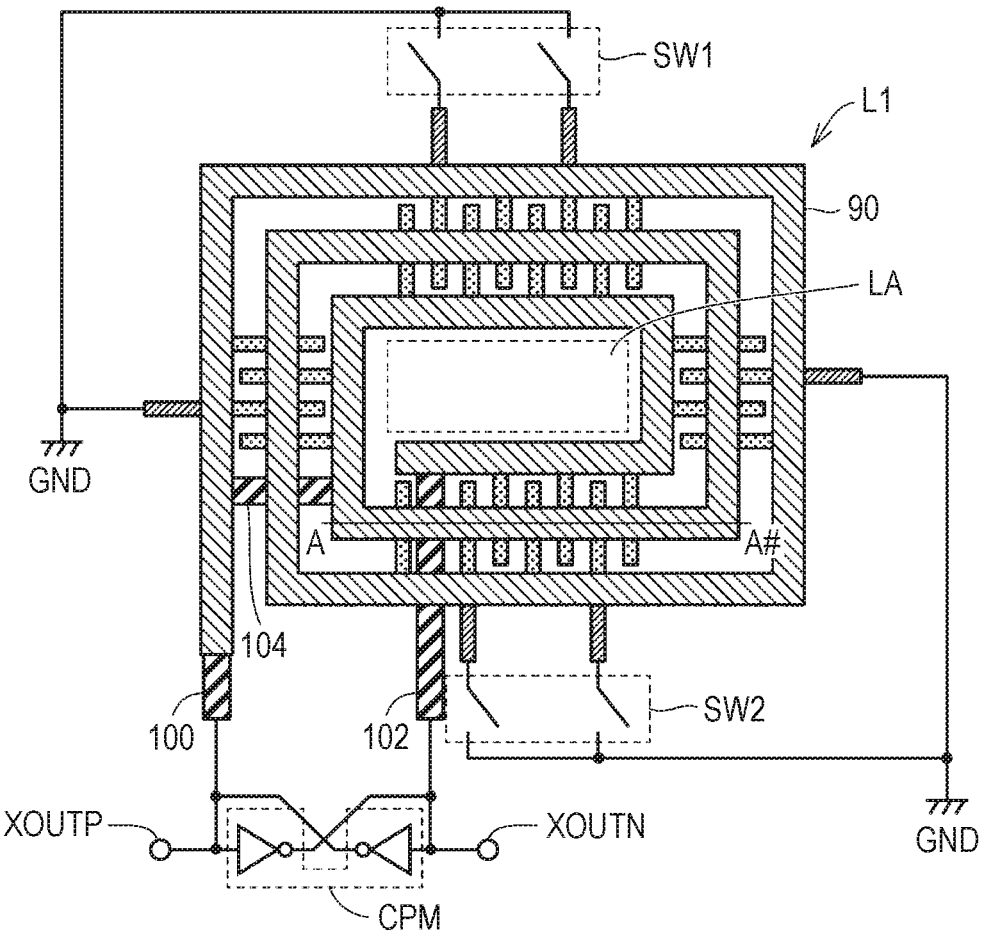
FIG. 4 is a top view of a layout of an inductor L1 and capacitors (capacitive elements) C1 and C2 of an oscillation circuit 42 based on First Embodiment.

FIG. 4 is a top view of a layout of an inductor L1 and capacitors (capacitive elements) C1 and C2 of an oscillation circuit 42 based on First Embodiment.

Referring to FIG. 4, in this example, a case where a spiral inductor is provided as the inductor L1 is illustrated.

In relation to this example, a description will be given mainly to a layout configuration of the inductor L1 and the capacitors C1 and C2. Switch circuits SW1, SW2 and a cross couple MOS circuit CPM other than these elements are shown as a circuit diagram.

The end of the central part of a wiring 90 of the inductor L1 and the end of the outer part of the wiring 90 of the inductor L1 are respectively coupled with the cross couple MOS circuit CPM. Specifically, the wiring 90 formed with the inductor L1 is respectively coupled with wirings 102 and 100 in a lower layer via a contact.

In this example, capacitors C1, C2 are not disposed in an upper-layer or a lower-layer position corresponding to the central area LA encircled with the wiring 90 of the inductor L1 provided as a spiral inductor. The capacitors C1 and C2 are disposed in an upper-layer or a lower-layer position corresponding to the peripheral area other than the central area LA.

Figure 5:
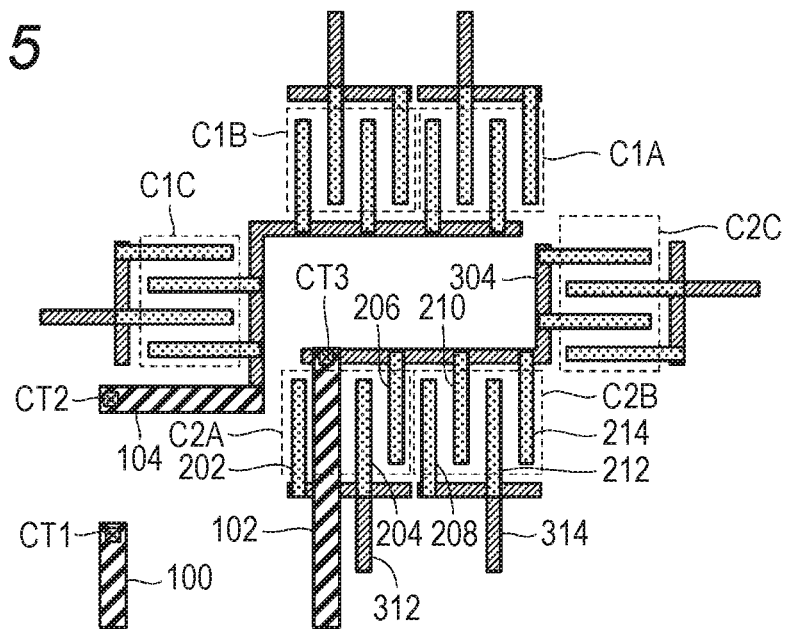
FIG. 5 is a top view of a layout of capacitors C1 and C2 based on First Embodiment.

FIG. 5 is a top view of a layout of the capacitors C1 and C2 based on First Embodiment.

Referring to FIG. 5, a top view of the capacitors C1 and C2 is illustrated with the inductor L1 excluded.

The end of the outer part of the inductor L1 is coupled with the wiring 100 via a contact CT1.

The end of the central part of the inductor L1 is coupled with the wiring 102 via a contact CT3.

The inductor L1 is coupled with a wiring 104 via a contact CT2.

The capacitors C1 and C2 are comb-shaped capacitors.

As the comb-shaped capacitors, for example, wirings 202, 204, and 206 configuring a capacitor C2A and wirings 208, 210, 212, and 214 configuring a capacitor C2B are provided.

The wirings 202 and 204 are coupled with a wiring 312 that is a ground node in a lower layer. The wiring 312 is coupled with ground voltage GND. The wiring 206 is coupled with a wiring 304 that is a common node. In the capacitive elements as viewed from above, the wirings 202 and 204 are provided so as to extend from one side to the other side. The wiring 206 is provided so as to extended from the other side to the one side. A wiring 203 forming a capacitive element in a layer lower than the wiring 102 is provided so as to extend from the other side to the one side.

The wirings 208 and 212 are coupled with a wiring 314 that is a ground node in a lower layer. The wiring 314 is coupled with ground voltage GND. The wirings 210 and 214 are coupled with the wiring 304 that is a common node. In the capacitive elements as viewed from above, the wirings 208 and 212 are provided so as to extend from the one side to the other side. The wirings 210 and 214 are provided so as to extended from the other side to the one side.

As viewed from above, the wirings 202, 204, 206, 208, 210, 212, and 214 are provided such that the lengthwise direction thereof is orthogonal to the wiring 90 of the inductor L1 forming a spiral inductor.

Figure 6:
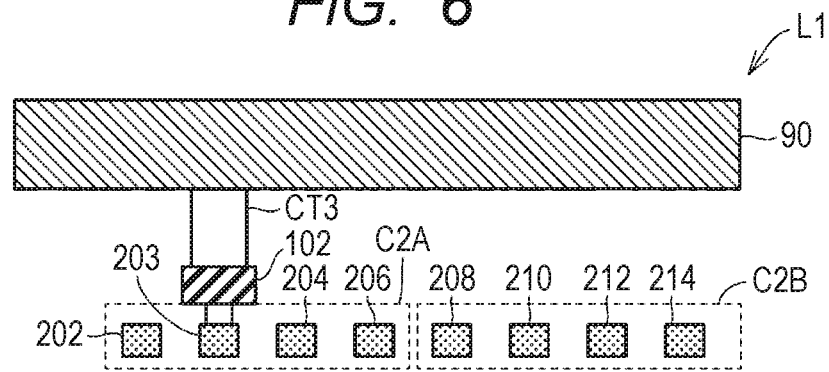
FIG. 6 is a drawing illustrating a section taken along line A-A # of FIG. 4 based on First Embodiment.

FIG. 6 illustrates a section taken along line A-A # of FIG. 4 based on First Embodiment.

Referring to FIG. 6, the wiring 90 of the inductor L1 is provided in an upper layer.

The wiring 90 is coupled with the wiring 102 disposed in a lower layer via the contact CT3.

The wirings 202, 203, 204, 206, 208, 210, 212, and 214 are disposed in a layer lower than the wiring 102.

The capacitor C2A is formed between the wirings 202 and 204 and between the wirings 203 and 206 which are provided in a comb shape. The capacitor C2B is formed between the wirings 208 and 212 and between the wirings 210 and 214 which are provided in a comb shape. This configuration is the same with a capacitor C2C and capacitors C1A to C1C.

According to a configuration based on First Embodiment, capacitors C1 and C2 are not disposed in an upper-layer or a lower-layer position corresponding to the central area LA encircled with the wiring 90 of the inductor L1 provided as a spiral inductor. Thus, since capacitors C1 and C2 are not disposed in an area where magnetic flux of the inductor L1 is concentrated, it is possible to suppress degradation in the characteristics of the inductor L1. That is, it is possible to suppress an inductance drop and Q-value reduction.

The wirings forming the capacitors configuring the capacitors C1 and C2 are disposed in a direction orthogonal to the wiring 90 configuring the inductor L1.

Therefore, a path of an eddy current induced by a magnetic field of the inductor L1 is blocked. For this reason, it is possible to prevent an inductance drop due to a mirror image effect.

Since the capacitors C1 and C2 are disposed in an upper-layer or a lower layer position corresponding to the peripheral area other than the central area LA, it is possible to suppress increase in layout area and implement size reduction.

Modification to First Embodiment

Figure 7:
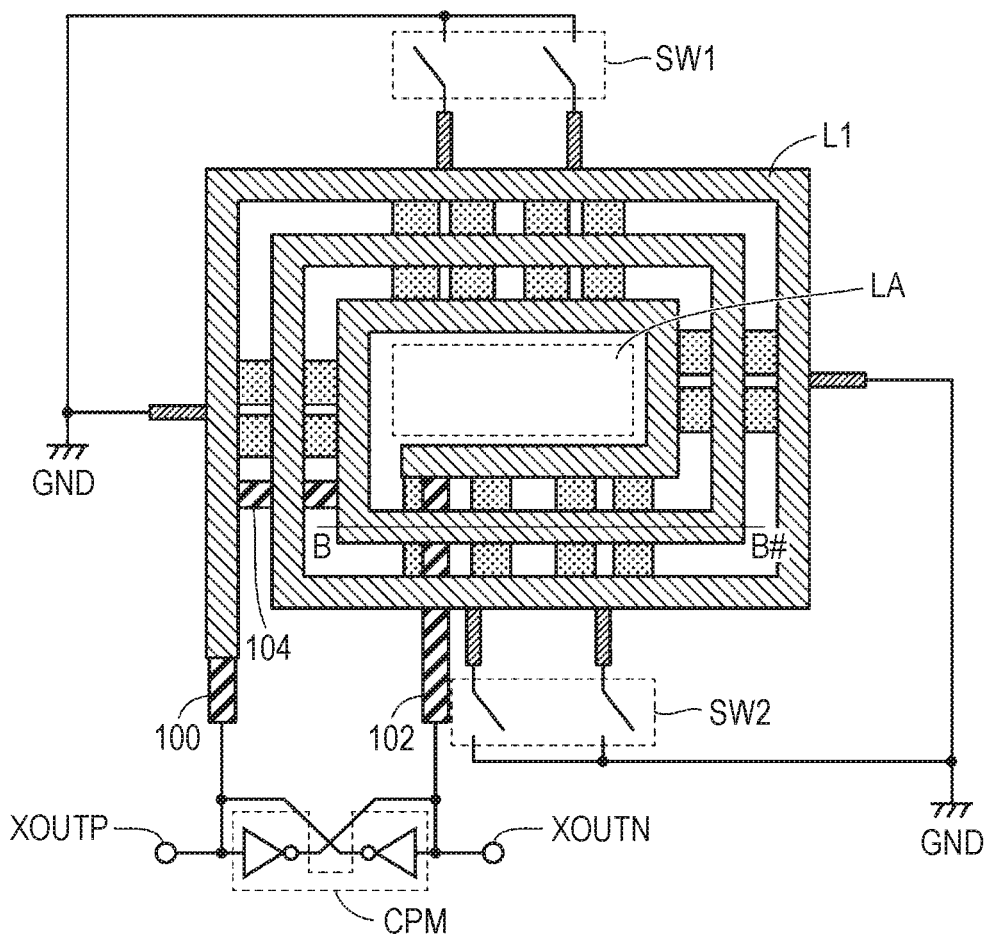
FIG. 7 is a top view of another layout of an inductor L1 and capacitors (capacitive elements) C1 and C2 of an oscillation circuit 42 based on a modification to First Embodiment.

FIG. 7 is a top view of another layout of an inductor L1 and capacitors (capacitive elements) C1 and C2 of an oscillation circuit 42 based on a modification to First Embodiment.

Referring to FIG. 7, in this example, a case where parallel flat capacitors are formed as the capacitors C1 and C2 is illustrated. Other configuration elements are identical with those described with reference to FIG. 4 and a detailed description thereof will not be repeated.

Figure 8:
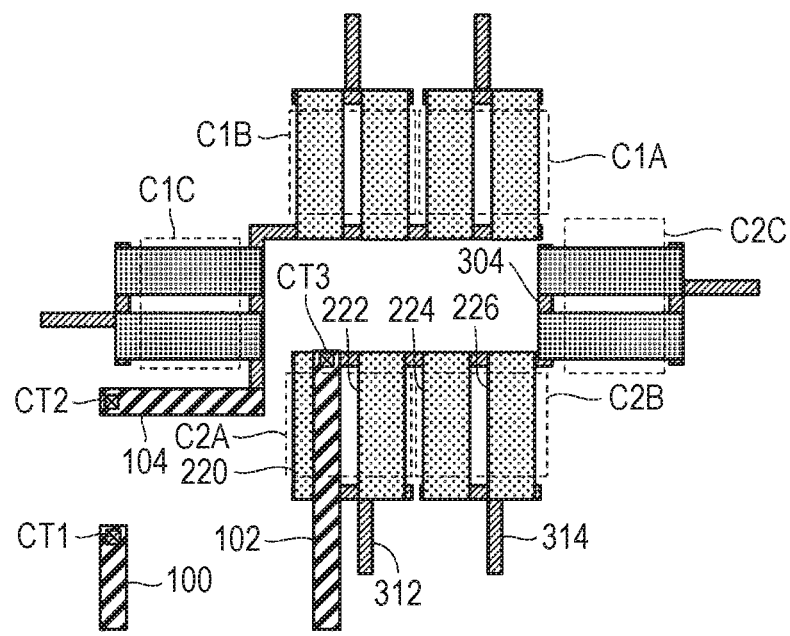
FIG. 8 is a top view of a layout of capacitors C1 and C2 based on a modification to First Embodiment.

FIG. 8 is a top view of a layout of capacitors C1 and C2 based on a modification to First Embodiment.

Referring to FIG. 8, a top view of the capacitors C1 and C2 is illustrated with the inductor L1 excluded.

The end of the outer part of the inductor L1 is coupled with a wiring 100 via a contact CT1.

The end of the central part of the inductor L1 is coupled with a wiring 102 via a contact CT3.

The inductor L1 is coupled with a wiring 104 via a contact CT2.

The capacitors C1 and C2 are parallel flat capacitors.

As the parallel flat capacitors, for example, wirings 220 and 222 configuring a capacitor C2A, and wirings 224 and 226 configuring a capacitor C2B are provided.

A wiring 221 forming a capacitor is provided in a layer lower than the wiring 220. A wiring 223 forming a capacitor is provided in a layer lower than the wiring 222. A wiring 225 forming a capacitor is provided in a layer lower than the wiring 224. A wiring 227 forming a capacitor is provided in a layer lower than the wiring 226.

Wirings 221 and 223, not shown, are coupled with a wiring 312 that is a ground node in a lower layer. The wiring 312 is coupled with ground voltage GND. The wirings 220 and 222 are coupled with a wiring 304 that is a common node.

Wirings 225 and 227, not shown, are coupled with a wiring 314 that is a ground node in a lower layer. The wiring 314 is coupled with ground voltage GND. The wirings 224 and 226 are coupled with a wiring 304 that is a common node.

As viewed from above, the wirings 220 to 227 are provided such that the lengthwise direction thereof is orthogonal to the wiring 90 of the inductor L1 forming a spiral inductor.

Figure 9:
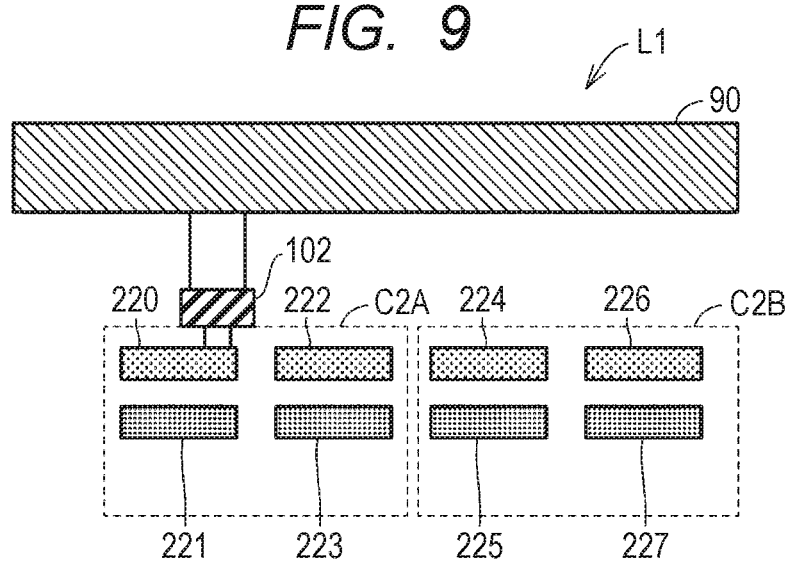
FIG. 9 is a drawing illustrating a section taken along line B-B # of FIG. 7 based on the modification to First Embodiment.

FIG. 9 illustrates a section taken along line B-B # of FIG. 7 based on the modification to First Embodiment.

Referring to FIG. 9, the wiring 90 of the inductor L1 is provided in an upper layer.

The wiring 90 is coupled with the wiring 102 disposed in a lower layer via the contact CT3.

The wirings 220, 222, 224, and 226 are disposed in a layer lower than the wiring 102.

The wirings 221, 223, 225, 227 are disposed in a layer further lower than the wirings 220, 222, 224, and 226.

A capacitor C2A is formed between the wiring 220 and the wiring 221 and between the wiring 222 and the wiring 223.

A capacitor C2B is formed between the wiring 224 and the wiring 225 and between the wiring 226 and the wiring 227.

This configuration is the same with a capacitor C2C and capacitors C1A to C1C.

Also according to a configuration based on the modification to First Embodiment, capacitors C1 and C2 are not disposed in an upper-layer or a lower-layer position corresponding to the central area LA encircled with the wiring 90 of the inductor L1 provided as a spiral inductor. Thus, since the capacitors C1, C2 are not disposed in an area where magnetic flux of the inductor L1 is concentrated, it is possible to suppress degradation in the characteristics of the inductor L1. That is, it is possible to suppress an inductance drop and Q-value reduction.

The wirings forming the capacitors configuring the capacitors C1 and C2 are disposed in a direction orthogonal to the wiring 90 configuring the inductor L1.

Therefore, a path of an eddy current induced by a magnetic field of the inductor L1 is blocked. For this reason, it is possible to prevent an inductance drop due to a mirror image effect.

Since the capacitors C1 and C2 are disposed in an upper-layer or a lower-layer position corresponding to the peripheral area other than the central area LA, it is possible to suppress increase in layout area and implement size reduction.

In the above description, a configuration in which the capacitors C1 and C2 are provided in a layer lower than the inductor L1 is taken as an example. The present invention is not limited to this and a configuration in which the capacitors C1 and C2 are provided in a layer higher than the inductor L1 may be adopted, needless to add.

In the above description, a case where an upper-layer wiring of the semiconductor device is used for the wiring 90 configuring a spiral inductor is taken as an example. Instead, a rewiring layer of the package may be used to configure the spiral inductor.

In the above description, a case where the wiring 102 and the line located between the wiring 90 in an upper layer and the wirings in a lower layer are provided to form coupling between the inductor L1 and the capacitors C1 and C2 is taken as an example. The present invention is not especially limited to this and a configuration in which a wiring in an upper layer and a wiring in a lower layer are directly coupled with each other may be adopted.

Second Embodiment

In relation to First Embodiment, a description has been given to a configuration in which the wiring 90 of the inductor L1 is provided in a rectangular shape as a spiral inductor. The present invention is not especially limited to this and any other shape may be adopted.

Figure 10:
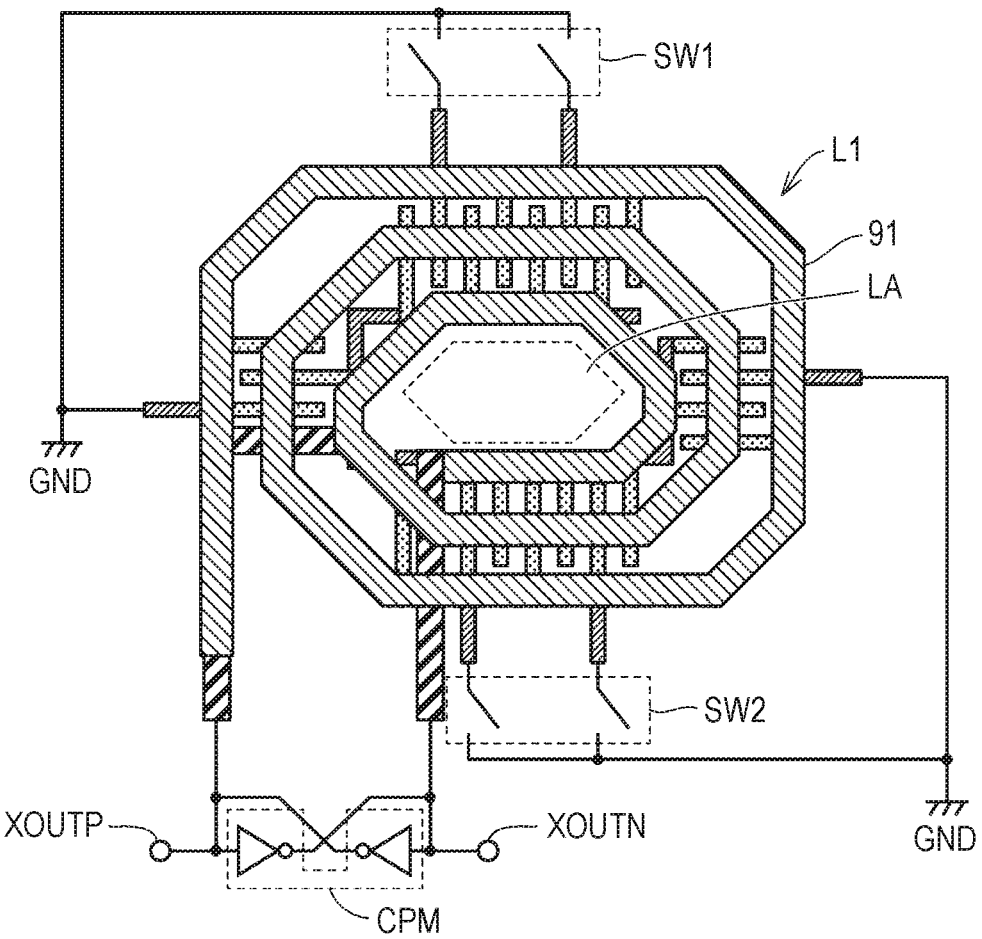
FIG. 10 is a top view of a layout of an inductor L1 and capacitors (capacitive elements) C1 and C2 of an oscillation circuit 42 based on Second Embodiment.

FIG. 10 is a top view of a layout of an inductor L1 and capacitors (capacitive elements) C1 and C2 of an oscillation circuit 42 based on Second Embodiment.

Referring to FIG. 10, in this example, a case where a polygonal wiring is used for a wiring of the inductor L1 is illustrated.

Specifically, a case where an octagonal wiring 91 is provided is illustrated. In conjunction therewith, the central area LA is formed not in a rectangular shape but in a hexagonal shape. Also in Second Embodiment, as in First Embodiment, capacitors C1 and C2 are not disposed in an upper-layer or a lower-layer position corresponding to the central area LA encircled with the wiring 91 of the inductor L1 provided as a spiral inductor. The capacitors C1 and C2 are disposed in an upper-layer or a lower-layer position corresponding to the peripheral area other than the central area LA.

Other configuration elements are identical with those described with reference to FIG. 4 and a detailed description thereof will not be repeated.

Figure 11:
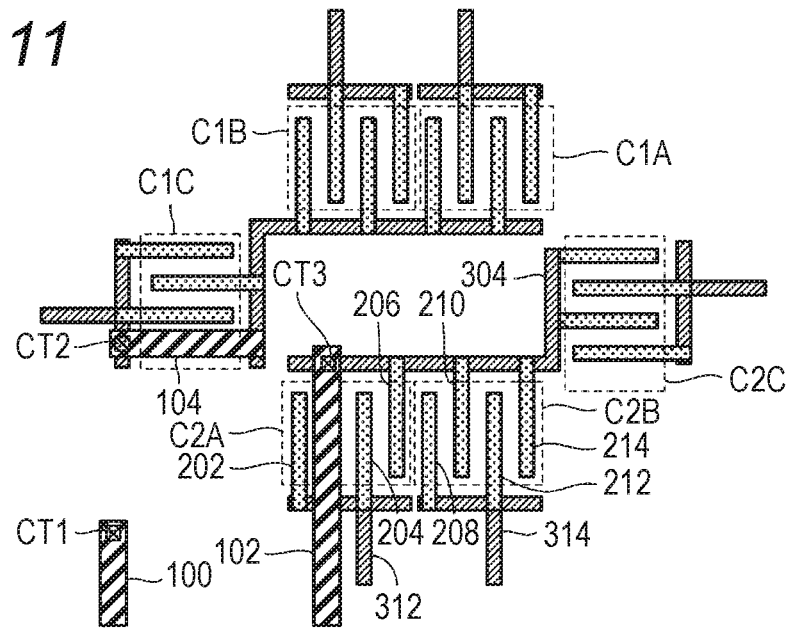
FIG. 11 is a top view of a layout of capacitors C1 and C2 based on Second Embodiment.

FIG. 11 is a top view of a layout of the capacitors C1 and C2 based on Second Embodiment.

Referring to FIG. 11, a top view of the capacitors C1 and C2 is illustrated with the inductor L1 excluded.

This layout is identical with the layout of the capacitors C1 and C2 described with reference to FIG. 5.

As viewed from above, the wirings 202, 204, 206, 208, 210, 212, and 214 are provided such that the lengthwise direction thereof is orthogonal to the wiring 91 of the inductor L1 forming a spiral inductor.

Therefore, a path of an eddy current induced by a magnetic field of the inductor L1 is blocked. For this reason, it is possible to prevent an inductance drop due to a mirror image effect.

Since the capacitors C1 and C2 are disposed in an upper-layer or a lower-layer position corresponding to the peripheral area other than the central area LA, it is possible to suppress increase in layout area and implement size reduction.

Third Embodiment

In relation to Second Embodiment, a description has been given to a configuration in which the wiring 91 of the inductor L1 is provided in a polygonal shape as a spiral inductor. The present invention is not especially limited to this and any other shape may be adopted.

Figure 12:
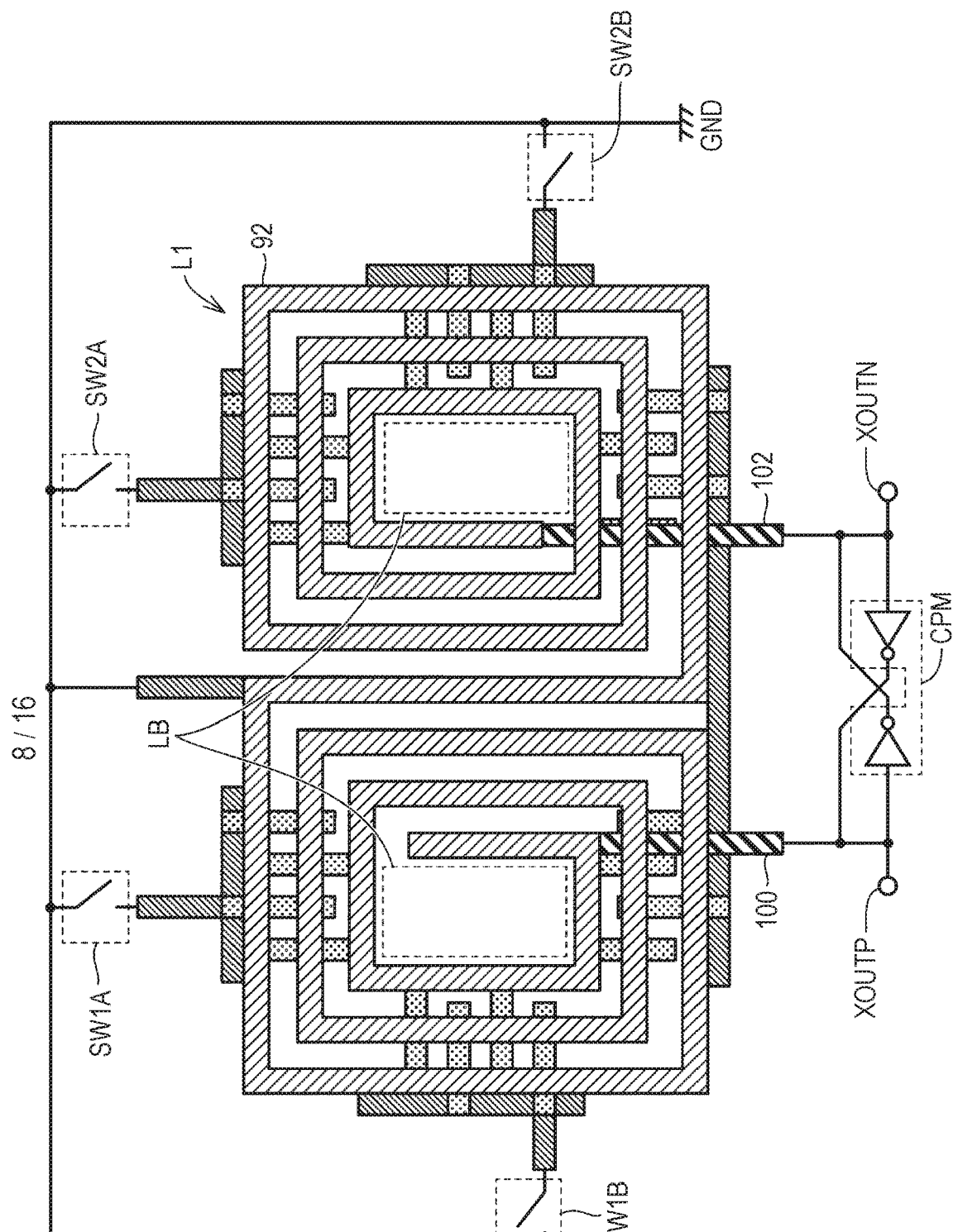
FIG. 12 is a top view of a layout of an inductor L1 and capacitors (capacitive elements) C1 and C2 of an oscillation circuit 42 based on Third Embodiment.

FIG. 12 is a top view of a layout of an inductor L1 and capacitors (capacitive elements) C1 and C2 of an oscillation circuit 42 based on Third Embodiment.

Referring to FIG. 12, in this example, a case where an 8-shaped wiring is used for a wiring of the inductor L1 is illustrated.

Specifically, a case where an 8-shape wiring 92 is provided is illustrated. A central area LB is formed at one end and the other end of the wiring 92 of the inductor L1.

Capacitors C1 and C2 are not disposed in an upper-layer or a lower-layer position corresponding to either central area LB encircled with the wiring 92 of the inductor L1 provided as a spiral inductor. The capacitors C1 and C2 are disposed in an upper-layer or a lower-layer position corresponding to the peripheral areas other than the central areas LB.

Figure 13:
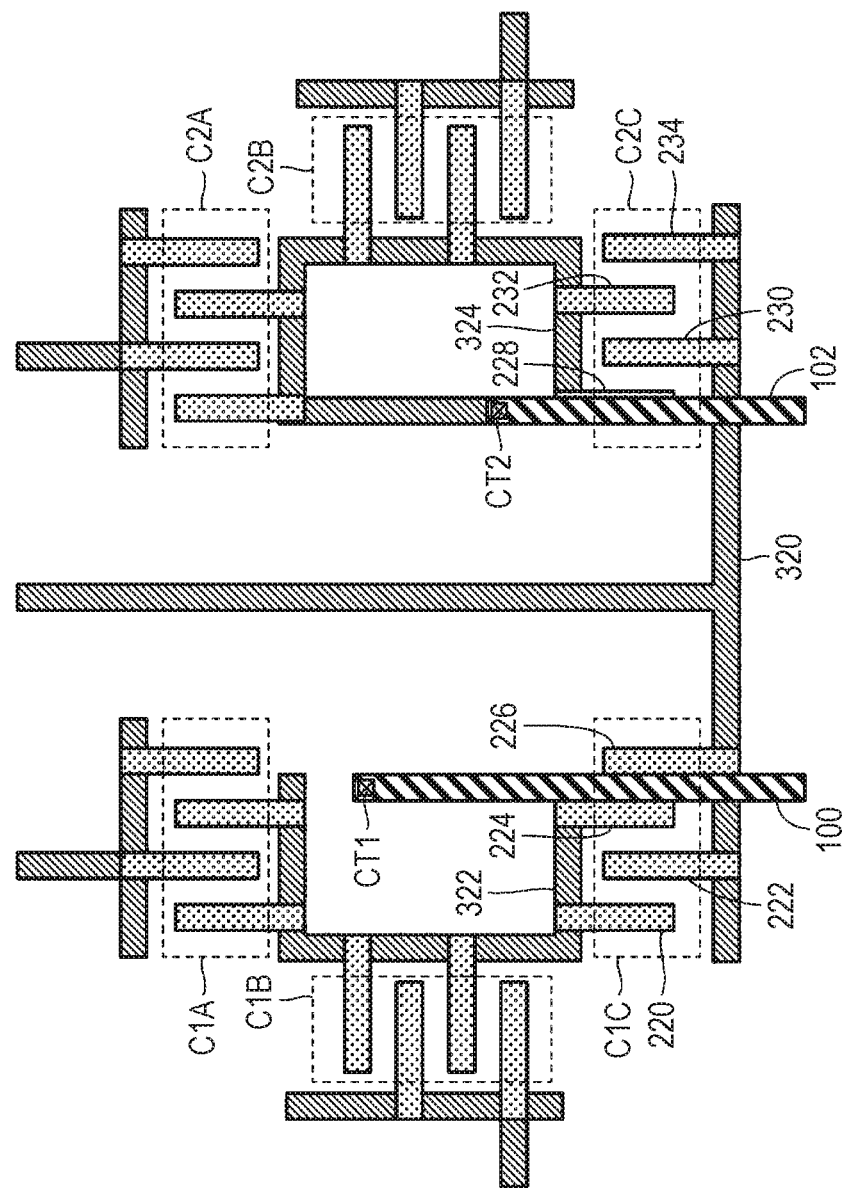
FIG. 13 is a top view of a layout of capacitors C1 and C2 based on Third Embodiment.

FIG. 13 is a top view of a layout of the capacitors C1 and C2 based on Third Embodiment.

Referring to FIG. 13, a top view of the capacitors C1 and C2 is illustrated with the inductor L1 excluded.

One end of the inductor L1 is coupled with a wiring 100 via a contact CT1 and the other end of the inductor L1 is coupled with a wiring 102 via a contact CT2.

The capacitors C1 and C2 are comb-shaped capacitors.

As the comb-shaped capacitors, for example, wirings 220, 222, 224, and 226 configuring a capacitor C1C and wirings 228, 230, 232, and 234 configuring a capacitor C2C are provided.

The wirings 222 and 226 are coupled with a wiring 320 that is a ground node in a lower layer. The wiring 320 is coupled with ground voltage GND. The wirings 220 and 224 are coupled with a wiring 322 that is a common node. In the capacitive elements as viewed from above, the wirings 222 and 226 are provided so as to extend from one side to the other side. The wirings 220 and 224 are provided so as to extend from the other side to the one side.

The wirings 230 and 234 are coupled with the wiring 320 that is a ground node in a lower layer. The wiring 320 is coupled with ground voltage GND. The wirings 228 and 232 are coupled with a wiring 324 that is a common node. In the capacitive elements as viewed from above, the wirings 230 and 234 are provided so as to extend from one side to the other side. The wirings 228 and 232 are provided so as to extend from the other side to the one side.

As viewed from above, the wirings 222, 224, 226, 228, 230, 232, and 234 are provided such that the lengthwise direction thereof is orthogonal to the wiring 92 of the inductor L1 forming a spiral inductor.

According to a configuration based on Third Embodiment, capacitors C1 and C2 are not disposed in an upper-layer or a lower-layer position corresponding to the central areas LB encircled with the wiring 92 of the inductor L1 provided as a spiral inductor. Thus, since the capacitors C1 and C2 are not disposed in an area where magnetic flux of the inductor L1 is concentrated, it is possible to suppress degradation in the characteristics of the inductor L1. That is, it is possible to suppress an inductance drop and Q-value reduction.

The wirings forming the capacitors configuring the capacitors C1 and C2 are disposed in a direction orthogonal to the wiring 92 configuring the inductor L1.

Therefore, a path of an eddy current induced by a magnetic field of the inductor L1 is blocked. For this reason, it is possible to prevent an inductance drop due to a mirror image effect.

Since the capacitors C1 and C2 are disposed in an upper-layer or a lower-layer position corresponding to the peripheral area other than the central areas LB, it is possible to suppress increase in layout area and implement size reduction.

Use of an 8-shaped wiring for the wiring of the inductor L1 enables suppression of leakage of a magnetic field to surrounding circuits.

Modification to Third Embodiment

Figure 14:
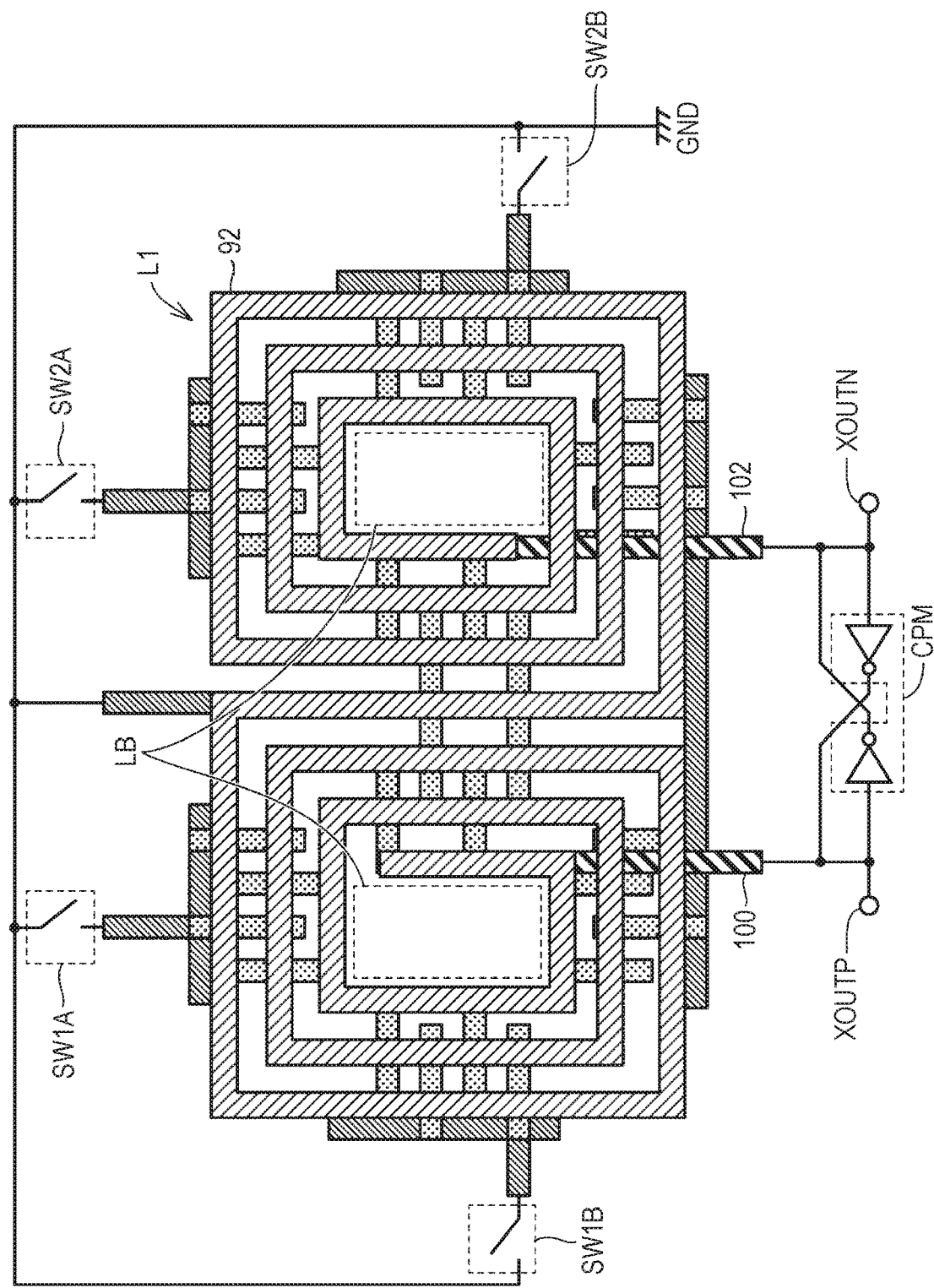
FIG. 14 is a top view of a layout of an inductor L1 and capacitors (capacitive elements) C1 and C2 of an oscillation circuit 42 based on a modification to Third Embodiment.

FIG. 14 is a top view of a layout of an inductor L1 and capacitors (capacitive elements) C1 and C2 of an oscillation circuit 42 based on a modification to Third Embodiment.

Referring to FIG. 14, in this example, a case where an 8-shaped wiring is used for the wiring of the inductor L1 is illustrated.

As compared with the configuration shown in FIG. 12, in this example, a case where a capacitor is additionally provided also in the central part of the 8 shape is illustrated. The added capacitor is not disposed in an upper-layer or a lower-layer position corresponding to either central area LB encircled with the wiring 92 of the inductor L1 provided as a spiral inductor. The added capacitor is disposed in an upper-layer or a lower-layer position corresponding to the peripheral area other than the central areas LB.

Figure 15:
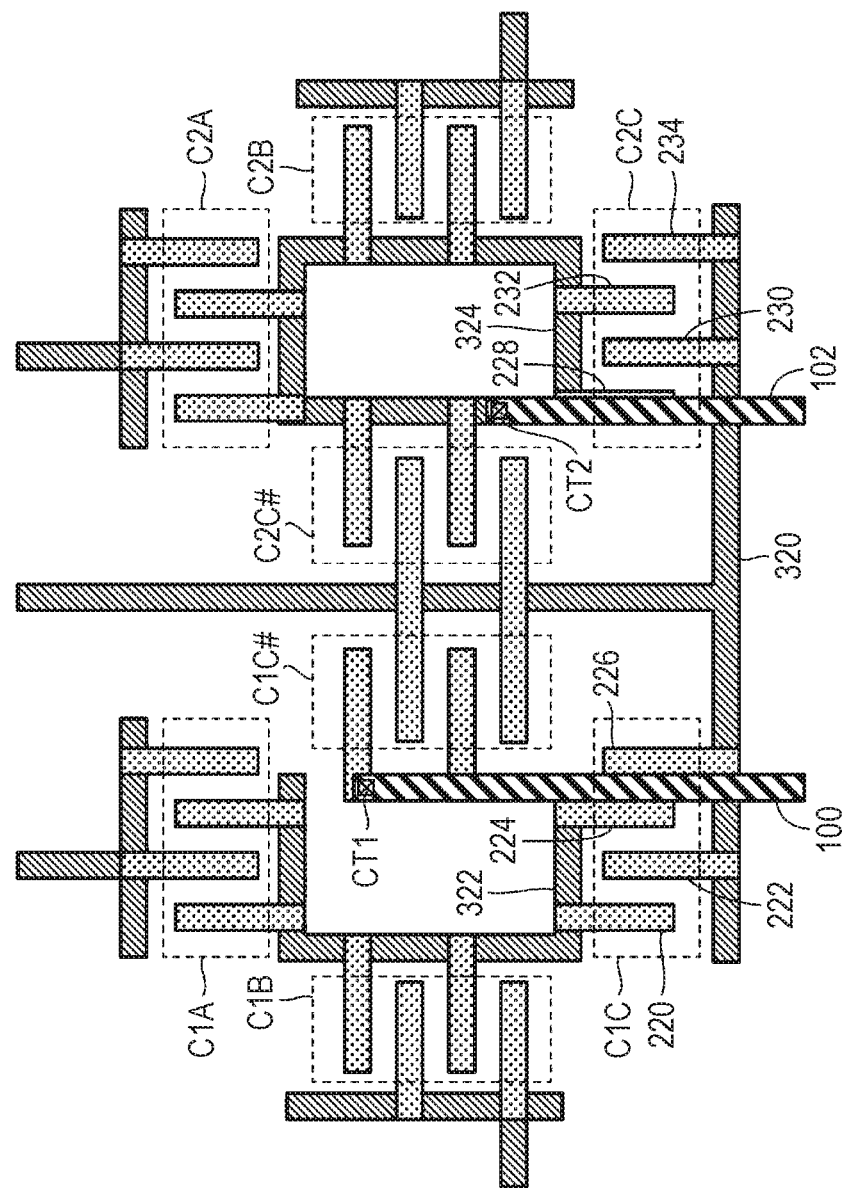
FIG. 15 is a top view of a layout of capacitors C1 and C2 based on a modification to Third Embodiment.

FIG. 15 is a top view of a layout of capacitors C1 and C2 based on a modification to Third Embodiment.

Referring to FIG. 15, as compared with configuration shown in FIG. 13, a top view showing a case where a capacitor C1C # is added to a capacitor C1C and a capacitor C2C # is added to a capacitor C2C is illustrated. Other configuration elements are identical with those shown in FIG. 13 and a detailed description thereof will not be repeated.

The wirings forming the added capacitors are also disposed in a direction orthogonal to the wiring 92 of the inductor L1.

Therefore, a path of an eddy current induced by a magnetic field of the inductor L1 is blocked. For this reason, it is possible to prevent an inductance drop due to a mirror image effect.

Fourth Embodiment

In relation to Fourth Embodiment, a description will be given to a configuration in which a wiring coupled with ground voltage is formed as a guard ring.

Figure 16:
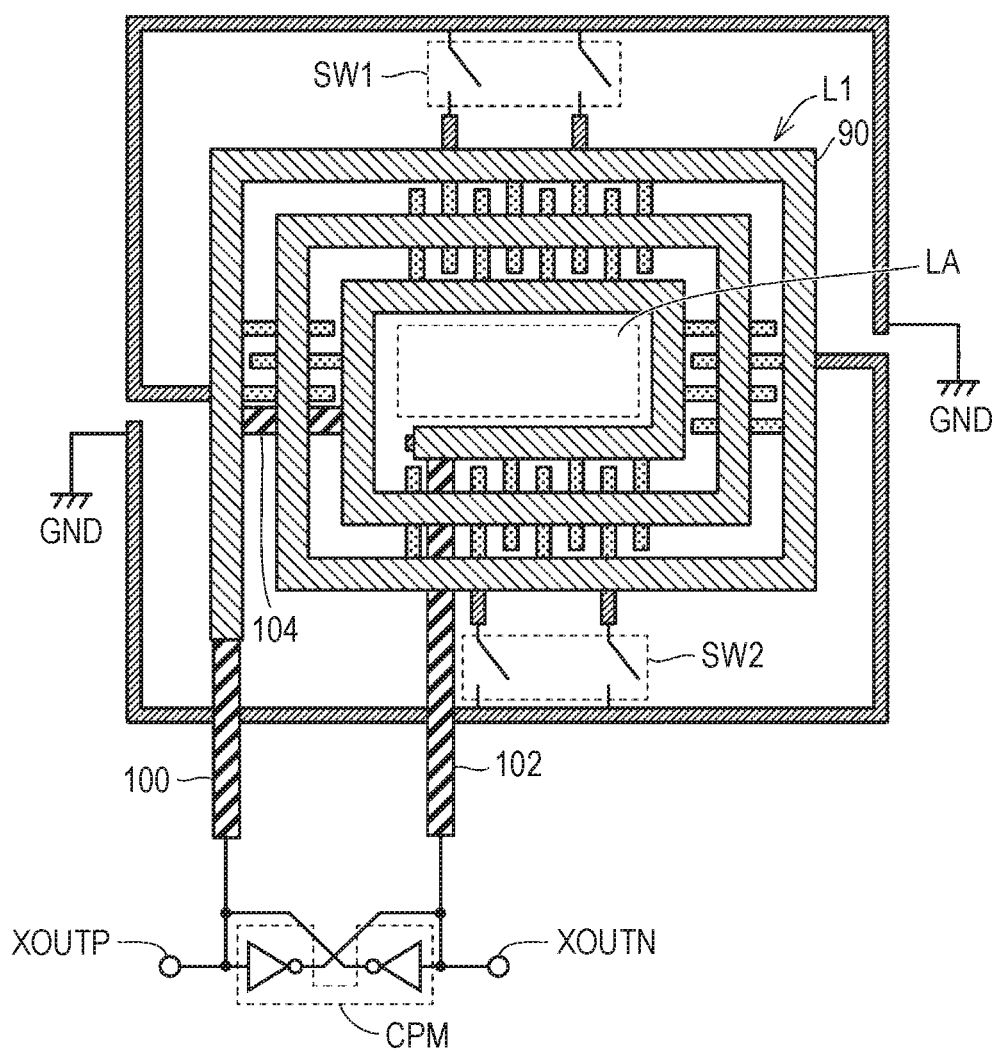
FIG. 16 is a top view of a layout of an inductor L1 and capacitors (capacitive elements) C1 and C2 of an oscillation circuit 42 based on Fourth Embodiment.

FIG. 16 is a top view of a layout of an inductor L1 and capacitors (capacitive elements) C1 and C2 of an oscillation circuit 42 based on Fourth Embodiment.

Referring to FIG. 16, as compared with the configuration shown in FIG. 4, a wiring coupled with ground voltage is provided as a guard ring outside the spiral inductor L1 and the capacitors C1 and C2.

Figure 17:
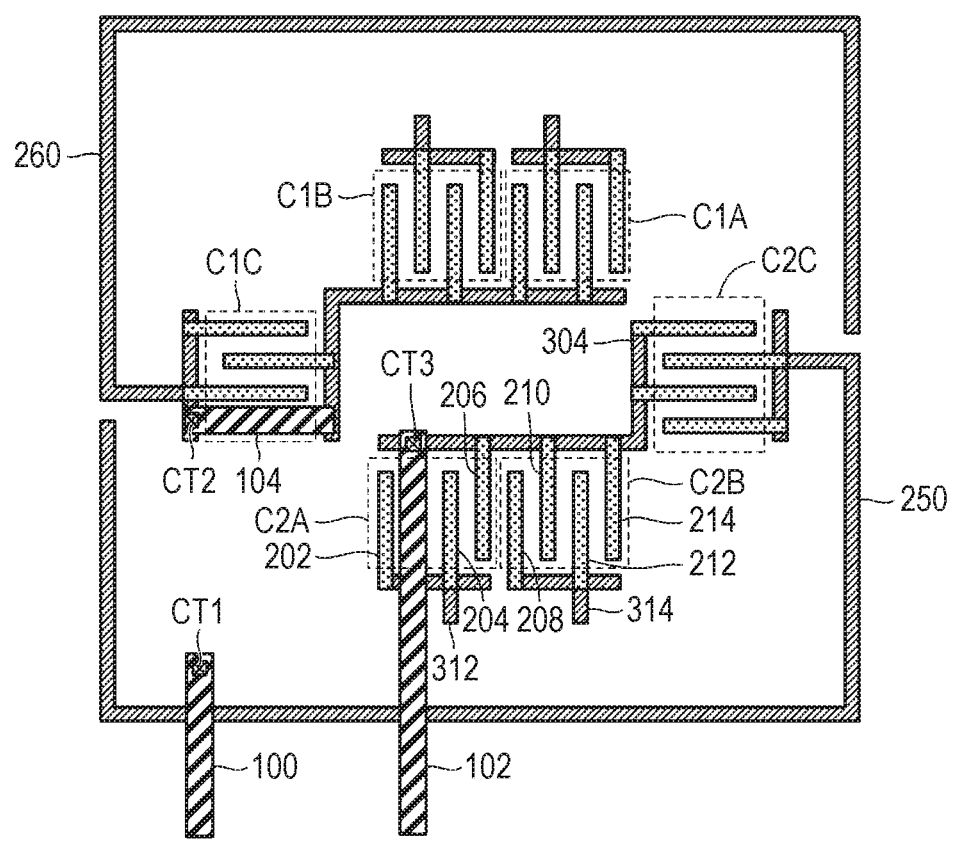
FIG. 17 is a top view of a layout of capacitors C1 and C2 based on Fourth Embodiment.

FIG. 17 is a top view of a layout of the capacitors C1 and C2 based on Fourth Embodiment.

Referring to FIG. 17, a top view of the capacitors C1 and C2 is illustrated with the inductor L1 excluded.

As compared with the configuration shown in FIG. 5, wirings 250 and 260 coupled with ground voltage are formed as a guard ring so as to surround the area of the spiral inductor L1 and the capacitors C1 and C2.

This configuration makes it possible to suppress influence (noise) of peripheral circuits on an LC circuit comprised of the spiral inductor L1 and the capacitors C1 and C2.

This makes it possible to further suppress degradation in the characteristics of the inductor L1.

Fifth Embodiment

In relation to the above embodiments, a description has been given to a layout configuration of the inductor L1 and the capacitors C1 and C2 in an LC oscillation circuit. The application of the present invention is not especially limited to an LC oscillation circuit and the present invention is also applicable to other circuits.

Figure 18:
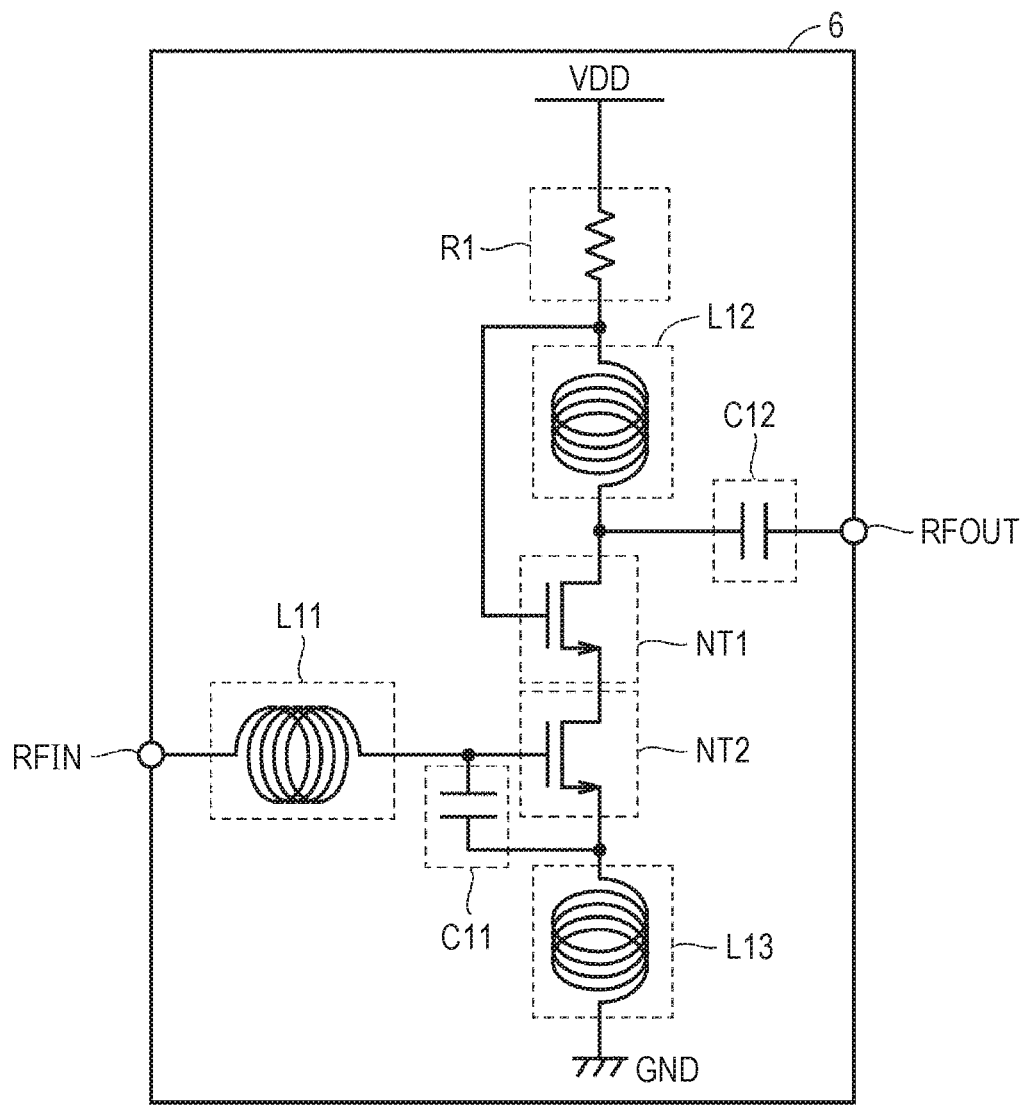
FIG. 18 is a circuit diagram of an LNA circuit 6 based on Fifth Embodiment.

FIG. 18 is a circuit diagram of an LNA circuit 6 based on Fifth Embodiment.

Referring to FIG. 18, the LNA circuit 6 includes a resistor R1, inductors L11, L12 and L13, capacitors C11 and C12, and N-channel MOS transistors NT1 and NT2.

One end of the inductor L11 is coupled with an input node RFIN. The input node RFIN has high frequency signals inputted thereto.

The other end of the inductor L11 is coupled with the gate of the N-channel MOS transistor NT2. The capacitor C11 is coupled between the source and gate of the N-channel MOS transistor NT2.

The source of the N-channel MOS transistor NT2 is coupled with ground voltage GND via the inductor L13.

One end of the inductor L12 is coupled with supply voltage VDD via the resistor R1.

The other end of the inductor L12 is coupled with one end of the capacitor C12.

The other end of the capacitor C12 is coupled with an output node RFOUT.

The other end of the inductor L12 is coupled with the drain of the N-channel MOS transistor NT2 via the N-channel MOS transistor NT1. The gate of the N-channel MOS transistor NT1 is coupled with a junction node between the resistor R1 and the one end of the inductor L12.

The inductor L13 is a parasitic inductor of the package (PKG) wiring.

Also in this configuration, an LC circuit is formed of the inductor L11 and the capacitor C11. In addition, an LC circuit is formed of the inductor L12 and the capacitor C12.

Figure 19:
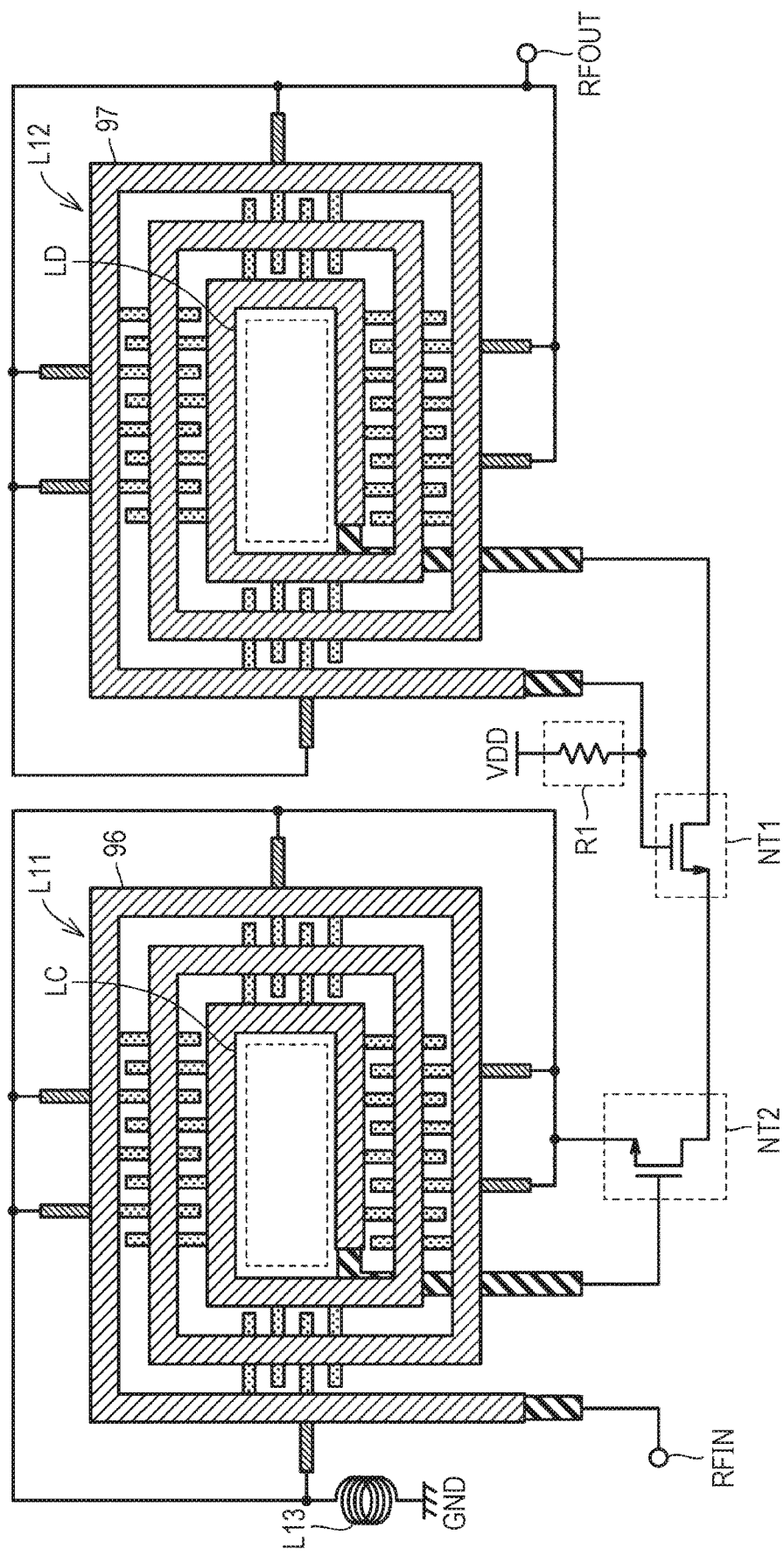
FIG. 19 is a top view of a layout of inductors L11 and L12 and capacitors (capacitive elements) C11 and C12 of an LNA circuit 6 based on Fifth Embodiment.

FIG. 19 is a top view of a layout of inductors L11 and L12 and capacitors (capacitive elements) C11 and C12 of an LNA circuit 6 based on Fifth Embodiment.

Referring to FIG. 19, in this example, a case where spiral inductors are provided as the inductors L11 and L12 is illustrated.

In relation to this example, a description will be given mainly to a layout configuration of the inductors L11 and L12 and the capacitors C1 and C2. N-channel MOS transistors NT1 and NT2 and an inductor L13 other than these elements are shown as a circuit diagram.

The end of the central part of a wiring 96 of the inductor L11 is coupled with the gate of the N-channel MOS transistor NT2. The end of the outer part of the wiring 96 of the inductor L11 is coupled with an input node RFIN.

The end of the outer part of a wiring 97 of the inductor L12 is coupled with a resistor R1 and the gate of the N-channel MOS transistor NT1. The end of the central part of the wiring 97 of the inductor L12 is coupled with the drain of the N-channel MOS transistor NT1.

In this example, capacitors C11 and C12 are not disposed in an upper-layer or a lower-layer position corresponding to the central area LC encircled with the wiring 96 of the inductor L11 provided as a spiral inductor or the central area LD encircled with the wiring 97 of the inductor L12. The capacitors C11 and C12 are disposed in an upper-layer or a lower-layer position corresponding to the peripheral areas other than the central areas LC and LD.

Figure 20:
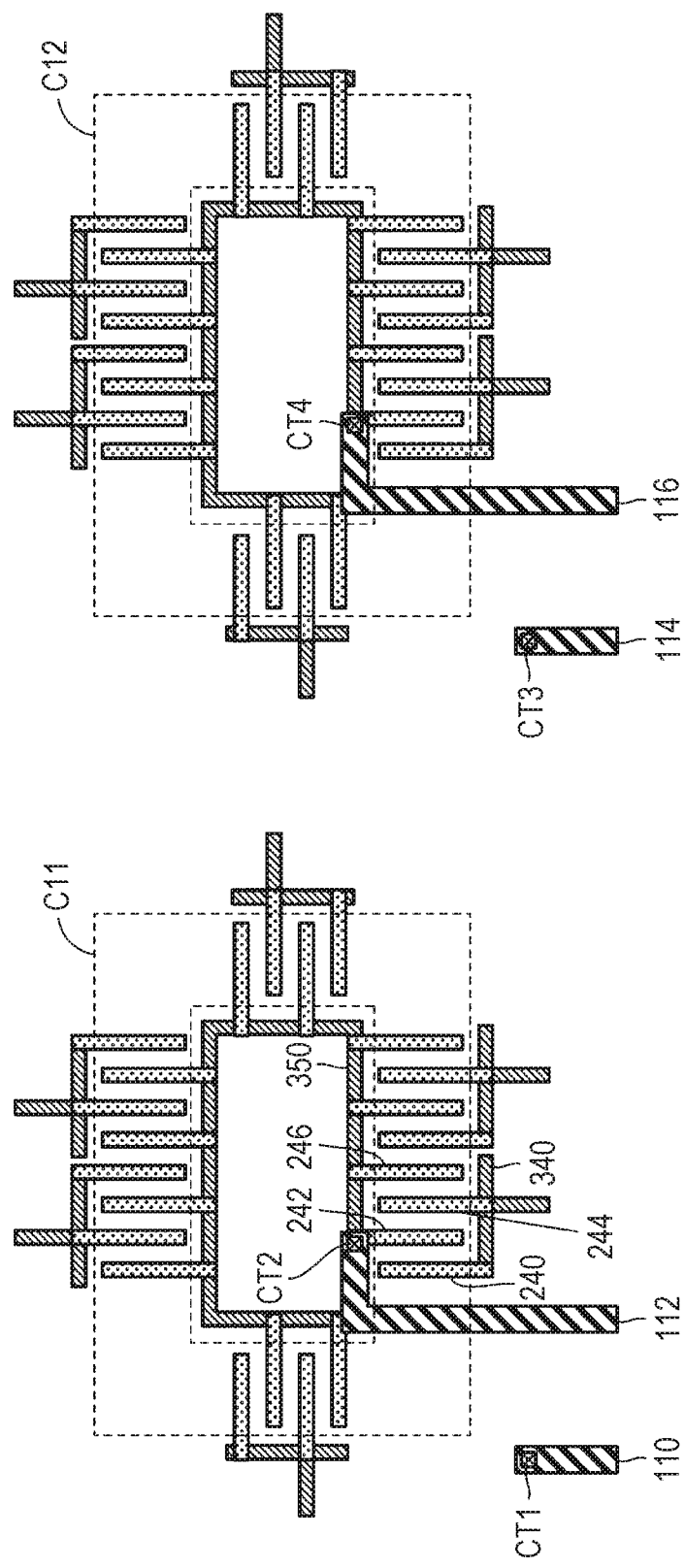
FIG. 20 is a top view of a layout of capacitors C11 and C12 based on Fifth Embodiment.

FIG. 20 is a top view of a layout of the capacitors C11 and C12 based on Fifth Embodiment.

Referring to FIG. 20, a top view of the capacitors C11 and C12 is illustrated with the inductors L11 and L12 excluded.

The end of the outer part of the inductor L11 is coupled with a wiring 110 via a contact CT1. The wiring 110 is coupled with an input node RIN. The end of the central part of the inductor L11 is coupled with a wiring 112 via a contact CT2. The wiring 112 is coupled with the gate of the N-channel MOS transistor NT2.

The end of the outer part of the inductor L12 is coupled with a wiring 114 via a contact CT3. The wiring 114 is coupled with the resistor R1 and the gate of the N-channel MOS transistor NT1. The end of the central part of the inductor L12 is coupled with a wiring 116 via a contact CT4. The wiring 116 is coupled with the drain of the N-channel MOS transistor NT1.

The capacitors C11 and C12 are comb-shaped capacitors. As the comb-shaped capacitors, for example, wirings 240, 242, 244, and 246 configuring the capacitor C11 are provided.

The wirings 240 and 244 are coupled with a wiring 340 in a lower layer. The wiring 340 is coupled with the source of the N-channel MOS transistor NT2.

The wirings 242 and 246 are coupled with a wiring 350 that is a common node.

In the capacitive elements as viewed from above, the wirings 240 and 244 are provided so as to extend from one side to the other side. The wirings 242 and 246 are provided so as to extend from the other side to the one side.

As viewed from above, the wirings 240, 242, 244 and 246 are provided such that the lengthwise direction thereof is orthogonal to the wiring 96 of the inductor L11 forming a spiral inductor.

The other wirings configuring the capacitor C11 are basically identical in configuration with the wirings 240 to 246.

The inductor L12 and the capacitor C12 are basically identical in configuration with the inductor L11 and the capacitor C11.

According to a configuration based on Fifth Embodiment, capacitors C11 and C12 are not disposed in an upper-layer or a lower-layer position corresponding to either of the central areas LC and LD encircled with the wirings 96 and 97 of the inductors L11 and L12 provided as spiral inductors. Thus, since the capacitors C11 and C12 are not disposed in an area where magnetic flux of the inductors L11 and L12 is concentrated, it is possible to suppress degradation in the characteristics of the inductors L11 and L12. That is, it is possible to suppress an inductance drop and Q-value reduction.

The wirings forming the capacitors configuring the capacitors C11 and C12 are disposed in a direction orthogonal to the wirings 96 and 97 configuring the inductors L11, L12.

Therefore, a path of an eddy current induced by magnetic fields of the inductors L11 and L12 is blocked. For this reason, it is possible to prevent an inductance drop due to a mirror image effect.

Since the capacitors C11 and C12 are disposed in an upper-layer or a lower-layer position corresponding to the peripheral areas other than the central areas LC and LD, it is possible to suppress increase in layout area and implement size reduction.

Up to this point, a specific description has been given to the present disclosure based on the embodiments. However, the present disclosure is not limited to the above embodiments and may be variously modified without departing from the subject matter thereof, needless to add.

What is claimed is:

1. A semiconductor device comprising:
   an LC circuit comprised of a spiral inductor provided over a semiconductor substrate and a capacitive element coupled with the spiral inductor,
   wherein the spiral inductor includes a central area encircled with a metal wiring and a peripheral area other than the central area,
   wherein the capacitive element is formed in an upper-layer or a lower-layer position corresponding to the peripheral area other than the central area,
   wherein the LC circuit includes a first LC circuit and a second LC circuit, the semiconductor device further comprising:
   first and second transistors coupled with the first and second LC circuits; and
   a resistance element,
   wherein one side of a first spiral inductor of the first LC circuit is coupled with an input node,
   wherein an other side of the first spiral inductor of the first LC circuit is coupled with a gate of the first transistor whose source side is coupled with first voltage and which is coupled in parallel with a first capacitive element of the first LC circuit,
   wherein one side of a second spiral inductor of the second LC circuit is coupled with second voltage via the resistance element,
   wherein an other side of the second spiral inductor of the second LC circuit is coupled with the second transistor in parallel with a second capacitive element of the second LC circuit coupled with an output node, and wherein one side of the second transistor is coupled with the second spiral inductor, an other side of the second transistor is coupled with the first transistor, and a gate of the second transistor is coupled with a junction node between the resistance element and the second spiral inductor.

2. The semiconductor device according to claim 1, wherein the capacitive element is equivalent to a comb-shaped capacitive element.

3. The semiconductor device according to claim 2, wherein a metal wiring in a lengthwise direction forming the comb-shaped capacitive element and a metal wiring of the spiral inductor are orthogonally formed in the upper-layer or lower layer position.

4. The semiconductor device according to claim 1, wherein the spiral inductor is formed of a polygonal metal wiring.

5. The semiconductor device according to claim 1, wherein the spiral inductor is formed of an 8-shaped metal wiring.

6. The semiconductor device according to claim 1, wherein one side of the capacitive element is coupled with the spiral inductor and the other side of the capacitive element is coupled with a ground wiring, and
   wherein the ground wiring is formed so as to surround the capacitive element.

7. The semiconductor device according to claim 1, further comprising:
   a plurality of capacitive elements;
   a switch circuit provided so as to be capable of switching coupling between the spiral inductor and the capacitive elements; and
   a cross couple circuit coupled with the spiral inductor and the capacitive elements.

* * * * *